United States Patent
Inoue

(10) Patent No.: US 7,741,614 B2
(45) Date of Patent: Jun. 22, 2010

(54) LITHOGRAPHY SYSTEM AND LITHOGRAPHY METHOD USING THE SAME

(75) Inventor: Hideo Inoue, Mishima (JP)

(73) Assignee: NuFlare Technology, Inc., Numazu-shi (JP)

( * ) Notice: Subject to any disclaimer, the term of this patent is extended or adjusted under 35 U.S.C. 154(b) by 408 days.

(21) Appl. No.: 11/762,491

(22) Filed: Jun. 13, 2007

(65) Prior Publication Data

US 2008/0006778 A1    Jan. 10, 2008

(30) Foreign Application Priority Data

Jul. 5, 2006    (JP) .............................. 2006-185732

(51) Int. Cl.
*H01J 3/26* (2006.01)

(52) U.S. Cl. ............ 250/400; 250/396 R; 250/396 ML; 250/492.1; 250/492.3

(58) Field of Classification Search ............. 250/492.1, 250/492.2, 492.22, 492.3, 396 R, 396 ML, 250/398, 400

See application file for complete search history.

(56) References Cited

U.S. PATENT DOCUMENTS 5,760,410 A * 6/1998 Matsuki et al. ........ 250/492.22
6,646,275 B2 * 11/2003 Oae et al. ................ 250/492.2

FOREIGN PATENT DOCUMENTS

| JP | 1-152726 | 6/1989 |
| JP | 2000-114137 | 4/2000 |
| JP | 20002252184 | 9/2000 |

* cited by examiner

*Primary Examiner*—Robert Kim
*Assistant Examiner*—Michael Maskell
(74) *Attorney, Agent, or Firm*—Oblon, Spivak, McClelland, Maier & Neustadt, L.L.P.

(57) ABSTRACT

The window-frame judgment unit judges that a section to be drawn has entered a window-frame area according to the main deflector data and the stage position information to output judgment signal. The main deflector calculator receives the main deflector data and calculates calculation data for driving a driving unit based on the main deflector data. The transfer controller detects output of the judgment signal and completion of drawing in the section under drawing to receive a transfer of the calculation data from the main deflector calculator and transfer the calculation data to the driving unit.

19 Claims, 6 Drawing Sheets

LITHOGRAPHY SYSTEM AND LITHOGRAPHY METHOD USING THE SAME

CROSS REFERENCE TO RELATED APPLICATIONS

This application is based on and claims the benefit of priority from prior Japanese Patent Application No. 2006-185732, filed on Jul. 5, 2006, the entire contents of which are incorporated herein by reference.

BACKGROUND OF THE INVENTION

1. Field of the Invention

The present invention relates to a lithography system and a lithography method using the same. More particularly, it relates to a lithography system and a lithography method that can accelerate processing of main deflector data in beam positioning.

2. Description of the Related Art

As the semiconductor circuits have become smaller and more highly integrated, a charged particle beam lithography system has increasingly been used instead of conventional photolithography system. The charged particle beam lithography system draws a pattern on a mask using a charged particle beam such as an electron beam.

In order to accelerate the drawing speed in electron beam patterning technologies, various technologies have been proposed, and they are now used in real systems. For example, a mode called "variable beam shape mode" is used. In this mode, a variable-shape beam having variable beam shapes may be projected according to a pattern shape to be formed, by overlapping first and second rectangle apertures. Thereby, as compared with the case where a circular beam is used, the number of exposure can be lowered greatly.

Moreover, a mode called "a continuous stage moving mode" is employed as a mode that improves a drawing speed by shortening the stage moving time. This mode draws each frame, by dividing a pattern to be drawn on a sample (a mask) into a strip-shaped "frame areas" and continuously moving the stage.

Moreover, "a vector scan mode" has been proposed as a deflection mode of an electron beam. A vector scan mode further divides a "frame area" into small areas called "sub-field areas", and the sub-field area is patterned by deflecting a variable shaped beam to its required part only (for instance, see JP H01-152726 A).

This mode employs two deflectors: a main deflector; and a auxiliary deflector. The main deflector serves for positioning a beam to one sub-field area. The auxiliary deflector serves for patterning in a sub-field area.

In a conventional lithography system using this mode, a time for processing auxiliary deflector data is longer than that for processing main deflector data. Therefore, a problem to be solved was to shorten the processing time of the auxiliary deflector data for shortening the patterning time.

However, since downsizing of the sub-field area is in progress recently, the number of the sub-field areas is increasing. For this reason, a processing time of the main deflector data is increasing, and a processing time of auxiliary deflector data is decreasing. Therefore, it is becoming eminent that the processing time for main deflector data affects the stage moving speed, and the throughput of the lithography system tends to become lower.

SUMMARY OF THE INVENTION

A lithography system according to an aspect of the invention deflects a beam to draw a desired pattern on a sample. The system comprises: a beam optical system that includes a deflector to deflect the beam; a driving unit that drives the deflector; a data generation circuit generating main deflector data for deflecting the beam to one of a plurality of sections, the sections being made by dividing patterning data representing a pattern to be drawn; a stage enabled to mount the sample; a position detector circuit detecting a position of the stage to obtain stage position information; a window-frame judgment unit judging that the section to be drawn has entered a window-frame area where the beam may be scanned according to the main deflector data and the stage position information to output a judgment signal; a main deflector calculator that receives the main deflector data as input in parallel with the window-frame judgment unit and calculates calculation data for driving the driving unit based on the main deflector data; and a transfer controller detecting output of the judgment signal and completion of drawing in the section under drawing to receive a transfer of the calculation data from the main deflector calculator and transfer the calculation data to the driving unit.

A drawing method according to one aspect of the present invention is adopted in a lithography system comprising a beam optical system that includes a deflector to deflect the beam, a driving unit that drives the deflector and a stage enabled to mount the sample. The method comprises: generating main deflector data for deflecting the beam to one of a plurality of sections, the sections being made by dividing patterning data representing a pattern to be drawn; detecting a position of the stage to obtain stage position information; judging that the section to be drawn has entered a window-frame area where the beam may be scanned according to the main deflector data and the stage position information to output a judgment signal; calculating calculation data for driving the driving unit based on the main deflector data in parallel with the step of outputting the judgment signal; and detecting that the judgment signal has been output and drawing in the section under drawing has been completed to transfer the calculation data to the driving unit.

DETAILED DESCRIPTION OF THE EMBODIMENTS

With reference to the accompanying drawings, a lithography system according to an embodiment of the present invention will be described in more detail below.

Figure 1:
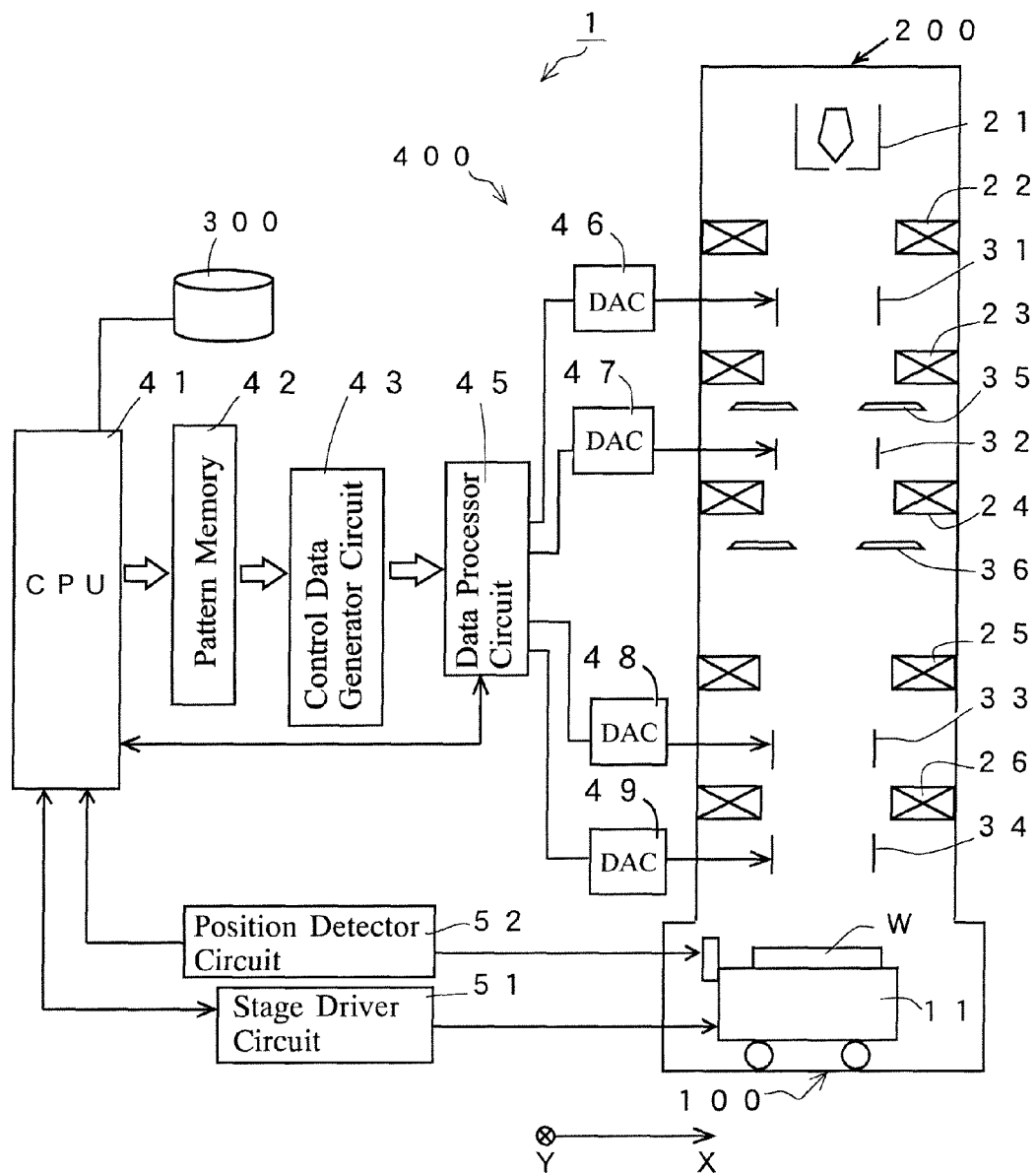
FIG. 1 is a schematic diagram of a configuration of an electron beam lithography system 1 according to an embodiment of the present invention.

FIG. 1 is a schematic diagram of a configuration of an electron beam lithography system 1 according to an embodiment of the present invention. The electron beam lithography system 1 generally includes a sample chamber 100, an electron beam optical system 200, a hard disk drive 300, and a control unit 400.

The sample chamber 100 contains a stage 11 that holds a sample W such as a mask thereon. A stage driver circuit 51 included in the control unit 400 drives the stage 11. The stage 11 is driven in the X direction (the horizontal direction in the plane of FIG. 1) and in the Y direction (the vertical direction in the plane of FIG. 1). A position detector circuit 52 included in the control unit 400 measures the position of the stage 11 after movement.

The electron beam optical system 200 resides in the upper portion of the sample chamber 100. The electron beam optical system 200 includes an electron gun 21, various lens 22, 23, 24, 25, and 26, a blanking deflector 31, a beam size adjusting deflector 32, a main deflector 33, an auxiliary deflector 34, beam shaping apertures 35 and 36, and the like.

The blanking deflector 31 has a function of switching between transmission or shutting off of the electron beam from the electron gun 21. The beam size adjusting deflector 32 has a function of controlling the cross-section of the electron beam using the beam shaping apertures 35 and 36.

The main deflector 33 has a function of positioning the electron beam to a certain sub-field area according to the main deflection data. The auxiliary deflector 34 has a function of positioning where the pattern is drawn in the sub-field positioned by the main deflector 33 according to the auxiliary deflection data.

Figure 2:
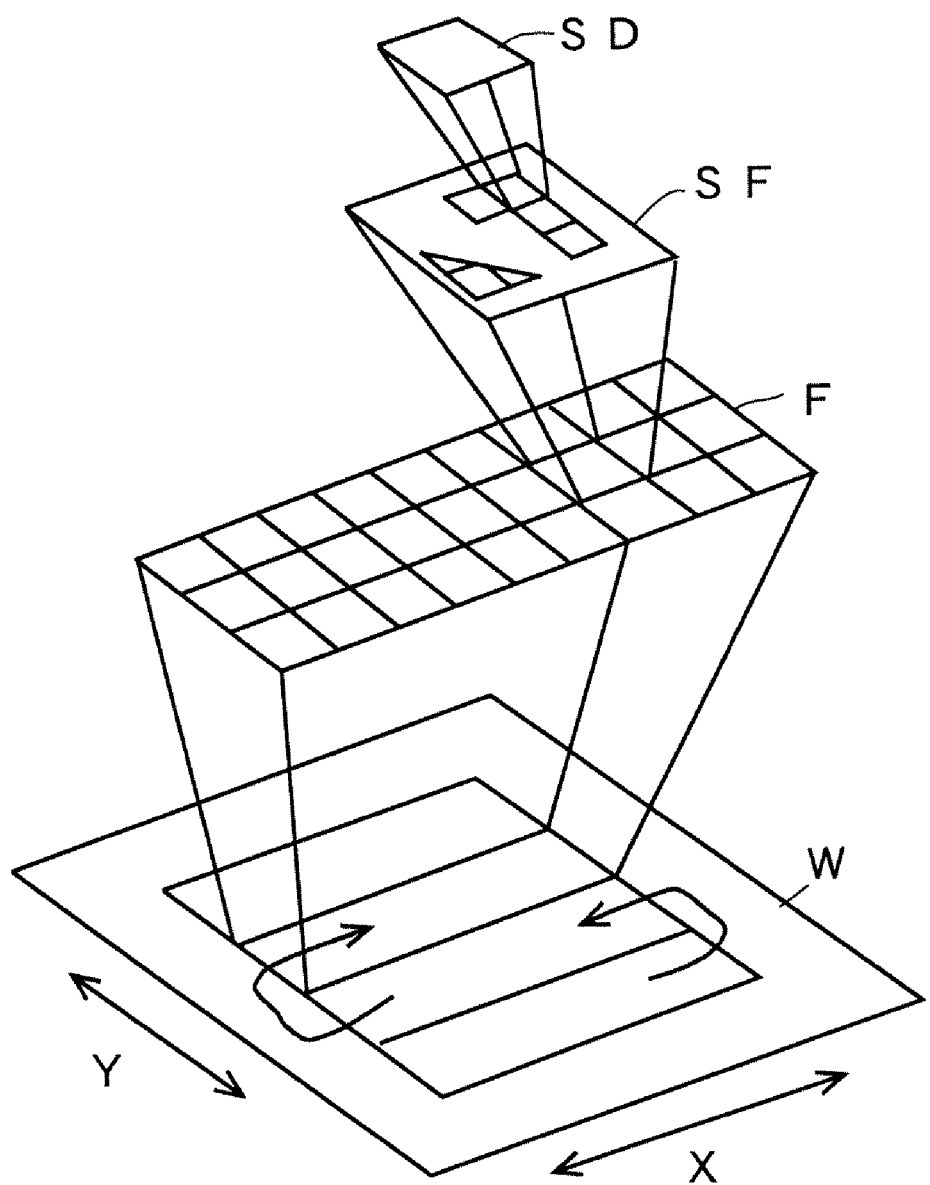
FIG. 2 is a schematic diagram illustrating the patterning operation by the deflectors 31 to 34 in FIG. 1.

The patterning operations of the deflectors 31 to 34 will be briefly described below with reference to FIG. 2. With the beam shape being controlled by the beam size adjusting deflector 32 and the beam shaping apertures 35 and 36 according to the shot data SD, the stage 11 is continuously moved in the X direction. With the main deflector 33 being controlled to follow the stage motion, the auxiliary deflector 34 is controlled to pattern one sub-field area SF.

Thus, after one sub-field area SF is successfully patterned, the next sub-field area, such as a sub-field SF in the positive Y direction, is then patterned. After the frame area F including a plurality of sub-field areas SF is successfully patterned, the stage 11 is stepwise moved in a direction (Y direction) orthogonal to the continuous motion direction (X direction). Such processes are repeated to sequentially pattern each frame area F. The frame area F is a strip-shaped area to be patterned that depends on the deflection width of the main deflector 33. The sub-field area SF is a unit area to be patterned that depends on the deflection width of the auxiliary deflector 34.

Referring back to FIG. 1, the hard disk drive 300 stores patterning data for use in patterning in the lithography system 1. The patterning data is derived by converting the design pattern data related to the pattern to be drawn.

The control unit 400 includes a CPU 41, a pattern memory 42, a control data generation circuit 43, a data processing circuit 45, DA converters 46 to 49, the stage driver circuit 51 (previously explained), and the position detector circuit 52 (previously explained). The CPU 41 is responsible for the control of the entire control unit 400. The pattern memory 42 temporarily stores, for each frame area F, the patterning data read from the hard disk drive 300 by the instruction from the CPU 41.

The control data generation circuit 43 has a function of generating various control data to control the deflectors 31 to 34 according to the patterning data for each frame area F stored in the pattern memory 42. By way of example, the control data generation circuit 43 generates, as control data, main deflection data to control the main deflector 33, auxiliary deflection data to control the auxiliary deflector 34, shot data for the beam size adjusting deflector 32 to provide the desired beam size, and blanking data to control the blanking operation by the blanking deflector 31. These set of control data are illustrative only and the data type or the like may be changed appropriately according to the configuration of the lithography system. Specifically, any control data may be used that controls the electron beam optical system 200 according to the patterning data representing the pattern to be drawn. The control data may be of any type and any name.

The data processing circuit 45 has a function of outputting the various control data from the control data generation circuit 43 to the D/A converters 46 to 49 at a predetermined timing.

Figure 3:
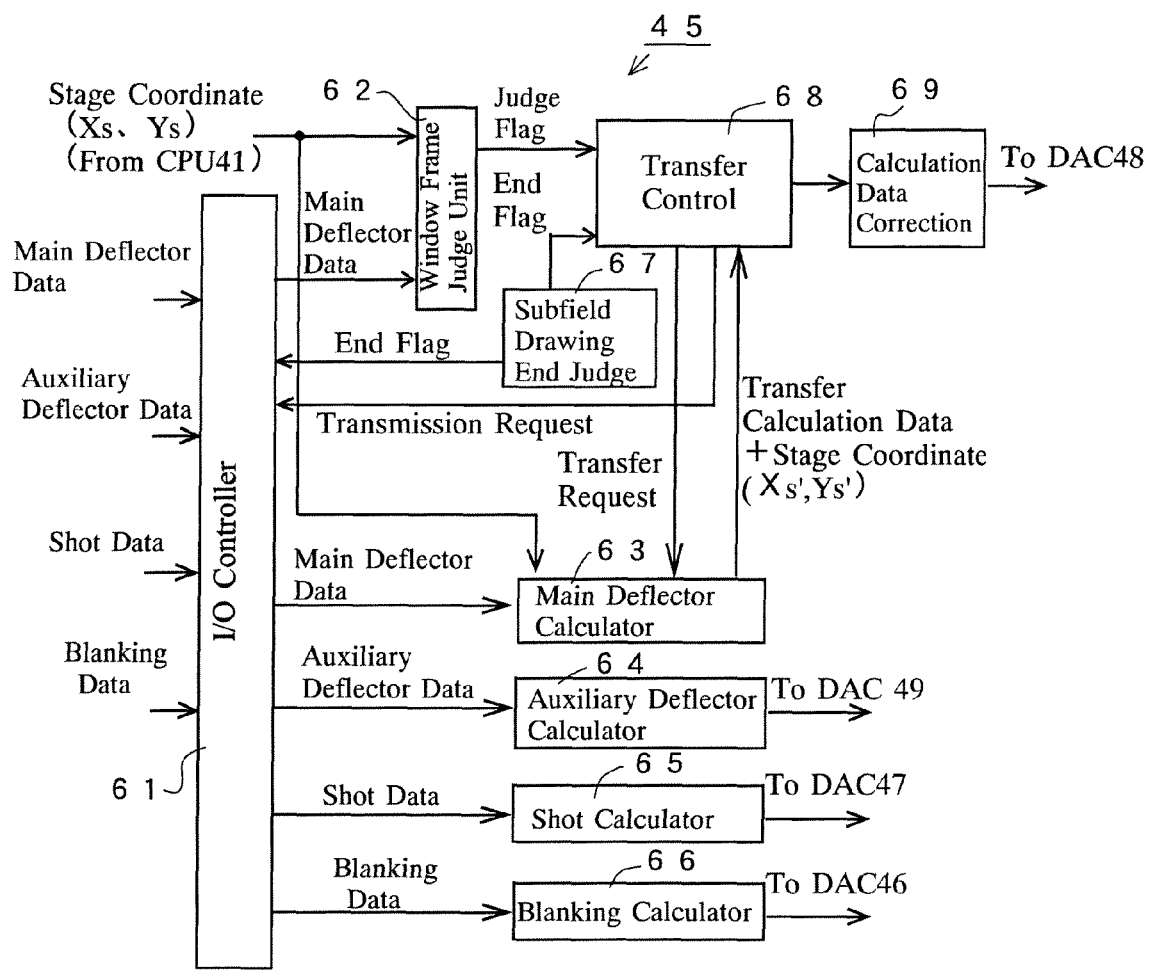
FIG. 3 is a block diagram of an example configuration of the data processing circuit 45 in FIG. 1.

FIG. 3 is a block diagram showing the example of configuration of the data processing circuit 45. This data processing circuit 45 comprises an I/O controller 61, a window frame judgment unit 62, a main deflector calculator 63, the auxiliary deflector calculator 64, a shot calculator 65, a blanking calculator 66, a Sub-field drawing end judgment unit 67, a transfer controller 68, and a calculation data correction unit 69.

The I/O controller 61 has a function of outputting, at a specified timing, control data such as blanking data, shot data, the main deflector data, and auxiliary deflector data inputted from the control data generator circuit 43.

The window frame judgment unit 62 has a function of judging that a sub-field area to be drawn next has entered an area (a window-frame area) where an electron beam may be scanned, based on the main deflector data and the stage coordinate (Xs, Ys) as position information of the stage 11, and outputting a judgment flag.

The calculators 63-66 conduct calculation based on blanking data, shot data, main deflector data, and auxiliary deflector data, respectively, and generate calculation data for controlling the deflectors 31-34.

Each of these calculators 63-66 receives data as input in parallel with the window-frame judgment unit 62, and generates calculation data for output to the DA converter 46-49 based on the data.

The main deflector calculator 63 generates the calculation data for the main deflection data at a certain stage position using data of a stage coordinate (Xs, Ys). Since the stage 11 is moving continuously, the main deflector calculator 63 computes this calculation data based on the stage coordinate (Xs, Ys) at that time at a predetermined timing.

The sub-field drawing end judgment unit 67 has a function of outputting an end flag when it is judged that drawing in a sub-field area under drawing at present has been completed. The completion of drawing in a sub-field area may be judged by measuring a time from output of the calculation data about the main deflector data by a timer. Alternatively, it may be judged by receiving a feedback from a circuit in charge of drawing. Various judging method may be adopted therefor.

The transfer controller 68 receives a judgment flag from the window-frame judgment unit 62, and an end flag from the sub-field drawing end judgment unit 67. When the transfer controller 68 receives the both of the flags, it has a function of receiving a transfer of the calculation data from the main deflector calculator 63 and transferring the calculation data to the calculation data correction unit 69. That is, the transfer controller 68 outputs a transfer request toward the main deflector calculator 63 in response to the confirmation that the both the judgment flag and the end flag have been received. When the main deflector calculator 63 receives this transfer request, it transmits the latest calculation data to the transfer controller 68, along with data of the stage coordinate (Xs', Ys') at the time of calculation of the calculation data.

The calculation data correction unit 69 has a function of correcting the calculation data transferred from the transfer controller 68 based on the difference between the stage coordinate (Xs', Ys') at the time of calculation and present or current stage coordinate (Xs, Ys). The corrected calculation data is output to the D/A converter 48. Such a correction enables the tracking in a sub-field area to be performed accurately.

In addition, the end flag output from the sub-field drawing end judgment unit 67 is provided not only to the transfer controller 68 but also to the I/O controller 61. If the I/O controller 61 receives this end flag, the I/O controller 61 transmits the main deflector data about the sub-field area to be drawn next towards the window-frame judgment unit 62 and the main deflector calculator 63.

Next, the operation of the electron-beam lithography system 1 according to this embodiment is explained with reference to FIG. 4. If the main deflector data of one sub-field area SFi is acquired (S1), the main deflector data will be input from the I/O controller 61 to the window-frame judgment unit 62 and the main deflector calculator 63 in parallel, thereby a window-frame judgment process (S2) and a main deflector calculation (S3) being performed in parallel.

In the step of main deflector calculation (S3), calculation data is generated at a predetermined interval based on the data of the latest stage coordinate (Xs, Ys), and old calculation data is discarded or abandoned.

While these steps are performed, settling and drawing in a sub-field area SFi−1, which is one step earlier than the sub-field area SFi, is executed in the electron beam optical system 200 (except for the case where the sub-field area SFi is the sub-field area drawn first of all).

At step S5, the sub-field drawing end judgment unit 67 performs judgment of whether the drawing of this sub-field area SFi−1 has been completed. When judged that it has been completed, the sub-field drawing end judgment unit 67 outputs an end flag to shift to step S7. When judged that it has not been completed yet, the calculation data calculated by the main deflector calculator 63 is discarded (S6), and step S5 is performed repeatedly.

At step S7, the transfer controller 68, which received the end flag, outputs the transfer request requesting a transfer of the calculation data calculated by the main deflector calculator 63. In response to this request, the main deflector calculator 63 transmits the latest calculation data to the transfer controller 68 with the data of the stage coordinate (Xs', Ys') at the time of the calculation.

The transmitted calculation data is subject to correction by the calculation data correction unit 69, and is output to the D/A converter 48, thereby the main deflector settling (S8) and the drawing (S9) of the sub-field area SFi being started.

Almost simultaneously with the steps S8 and S9, the main deflector data of the sub-field area SFi+1 to be drawn next is fetched to the window-frame judgment unit 62 and the main deflector calculator 63 according to the transfer request from the transfer controller 68 (S1). Thereby, the window-frame judgment (S2) about the sub-field area SFi+1 and main deflector calculation (S3) are performed in parallel with the step S8 and the step S9. Hereafter, the same processes are repeated for the subsequent sub-field areas (N, N+1, N+2 . . . ).

Figure 4:
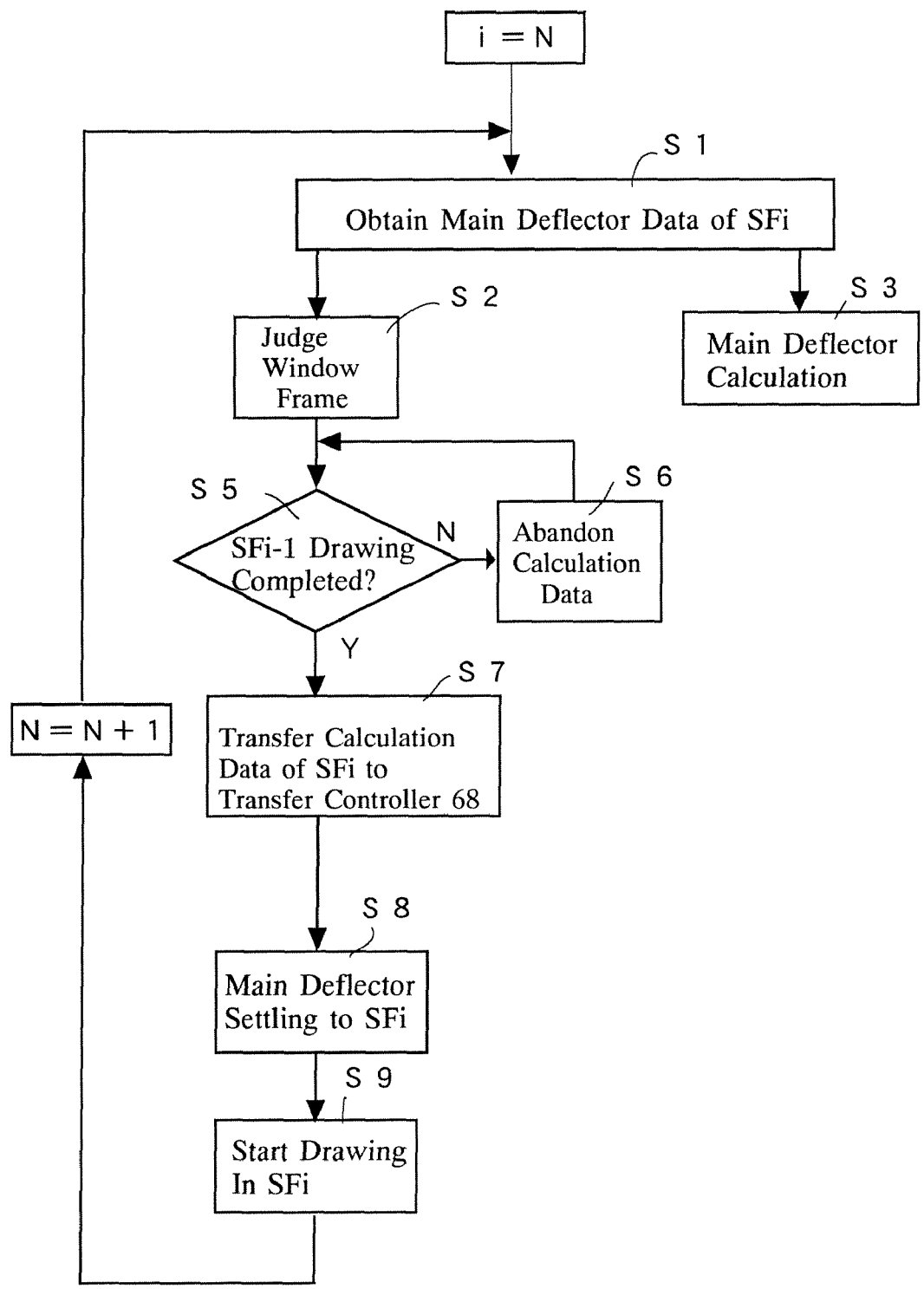
FIG. 4 is a schematic diagram of the operation of an electron beam lithography system 1 according to an embodiment of the present invention.
Figure 5:
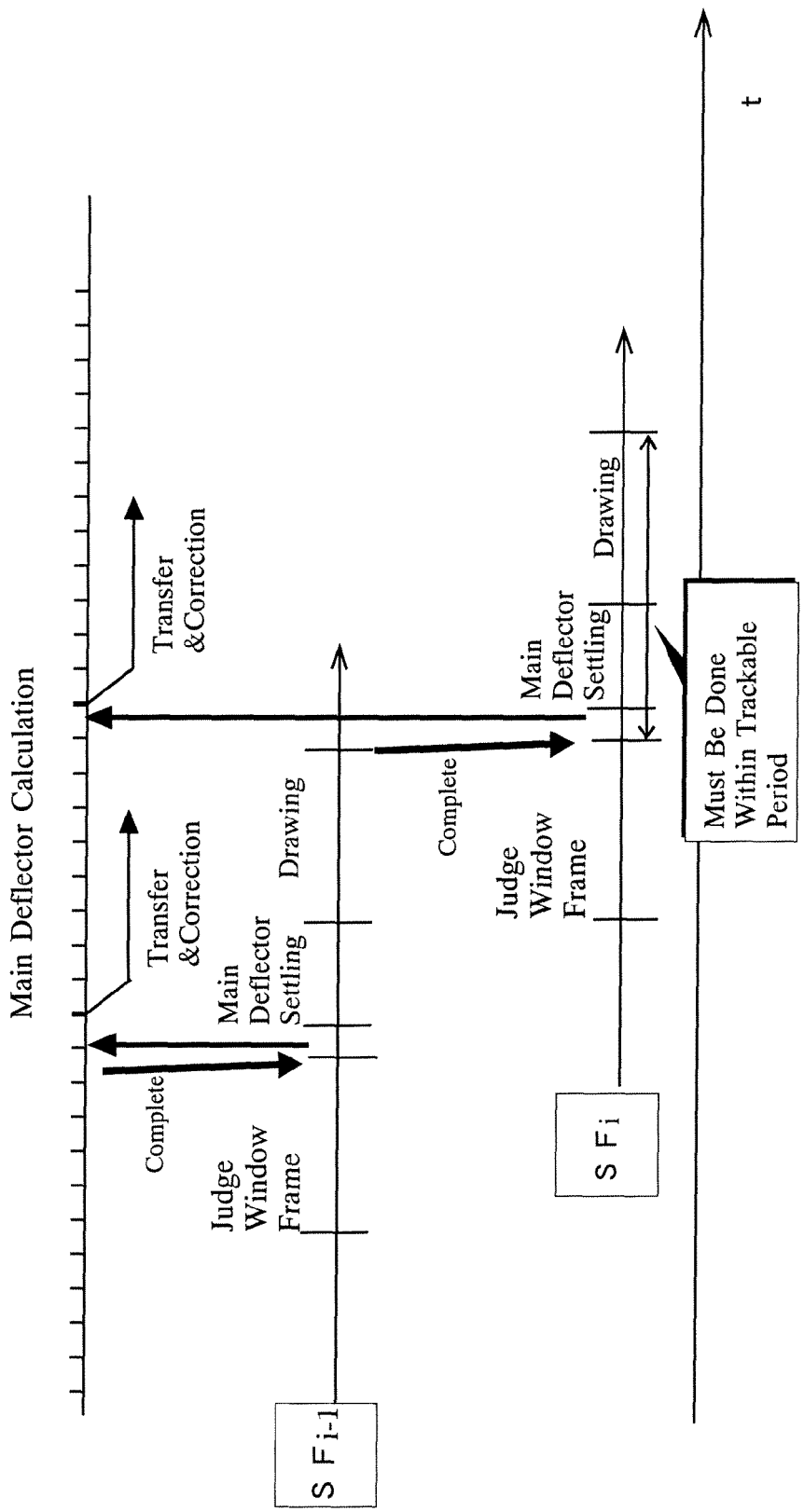
FIG. 5 explains an advantage of the embodiment of the present invention.

As shown in FIG. 5, the method explained in this FIG. 4 enables the window-frame judgment and main deflector calculation for the next sub-field area SFi to be performed while the main deflector settling and drawing of the sub-field area SFi−1 are performed. Moreover, the main deflector calculation is performed in parallel to window-frame judgment. Therefore, the time for window-frame judgment and the time for main deflector calculation are substantially zero. That is, transferring the main deflector calculation data and correction thereof are everything that should be finished during a period tracking is possible, except for the main deflector settling and drawing operation.

Figure 6:
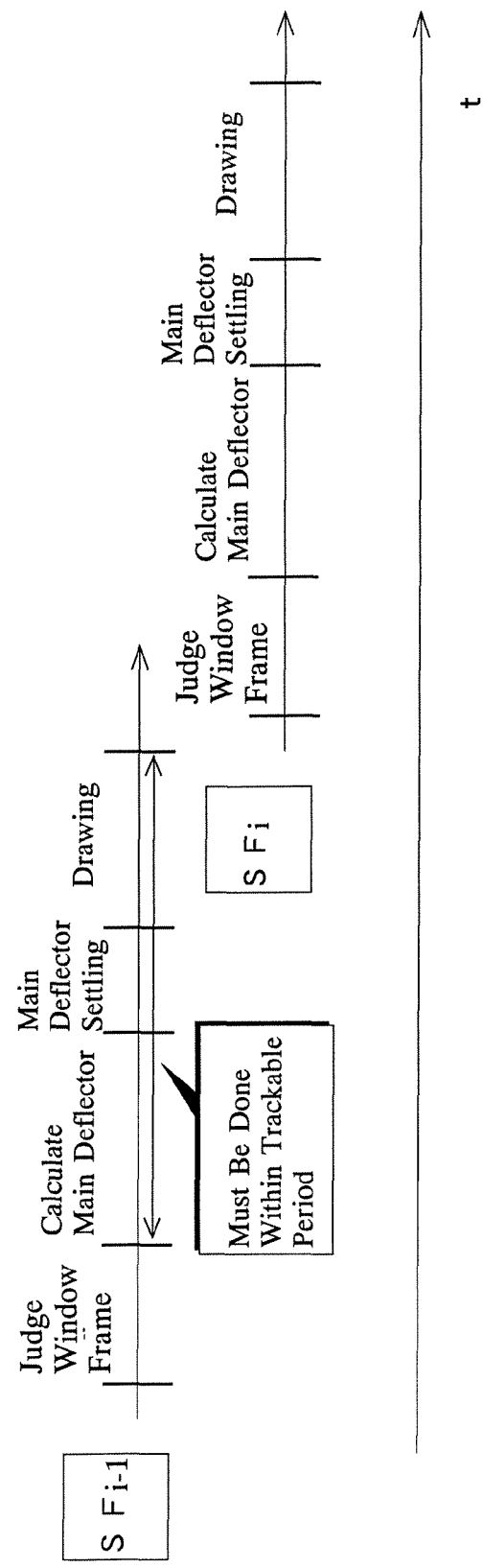
FIG. 6 explains a patterning operation in an conventional electron beam lithography system.

On the other hand, the process of the drawing including the main deflector data processing in the conventional lithography system is as follows, as shown in FIG. 6.

(1) Judge that a sub-field area (SFi−1) to be drawn has entered an area in which an electron beam can be scanned (a window-frame area) based on the main deflector data and the position information of a stage (window-frame judgment)

(2) On detecting that the sub-field area has entered the window-frame area, obtain the position information of the stage at that time and calculate calculation data for driving a main deflector amplifier based on the stage position information and the main deflector data (main deflector calculation)

(3) Control the main deflector amplifier so that an electron beam is located in the sub-field area to be drawn based on the main deflector calculation data (the main deflector settling)

(4) As soon as the main deflector settling is completed, start drawing the sub-field area based on auxiliary deflector data (drawing).

(5) If drawing is completed, perform window-frame judgment of the sub-field area (SFi) to be drawn next. Thereafter, the above-mentioned steps (1) -(4) are repeated for the sub-field area.

According to such processes, a processing time from the completion of the window-frame judgment ((1)) and until the completion of drawing (a trackable period) is limited by the distance (a trackable distance) in which tracking of an electron beam is possible. Moreover, the processing time must be shorter as the moving speed of a stage becomes faster (the trackable period=the trackable distance/the moving speed of the stage).

If this processing time, especially the time of the main deflector calculation process can be shortened, the moving speed of the stage can be made faster, and the throughput of the lithography system can be improved.

According to the embodiment, the trackable period can be shortened compared to the conventional technologies shown in FIG. 6. This means that a stage moving speed can be made faster and improvement in the throughput of lithography system may be obtained.

Thus, although the invention has been described with respect to particular embodiments thereof, it is not limited to those embodiments. It will be understood that various modifications, substitutions, additions, deletions, and the like may be made without departing from the spirit of the present invention. Although, for example, FIG. 3 shows an example configuration of the data processing circuit 45, it is only an example where the data processing circuit 45 is implemented in hardware, and other hardware configuration may be used. The data processing circuit 45 may also be implemented in software.

Although the above embodiments illustrate the electron beam lithography system using the variable shaped beam scheme and the continuous stage motion scheme, the present invention is applicable to electron beam lithography systems using other schemes. In addition to the electron beam lithography system, the present invention is also applicable to the lithography system using laser or the like.

What is claimed is:

1. A lithography system that deflects a beam to draw a desired pattern on a sample, the system comprising:
   a beam optical system that includes a deflector to deflect the beam;
   a driving unit that drives the deflector;
   a data generation circuit programmed or configured to generate main deflector data to deflect the beam to one of a plurality of sections, the sections being made by dividing patterning data representing a pattern to be drawn;
   a stage enabled to mount the sample;
   a position detector to detect a position of the stage to obtain stage position information;
   a window-frame judgment unit programmed or configured to judge that the section to be drawn has entered a window-frame area where the beam may be scanned according to the main deflector data and the stage position information to output a judgment signal;
   a main deflector calculator programmed or configured to receive the main deflector data as input in parallel with the window-frame judgment unit and to calculate calculation data for driving the driving unit based on the main deflector data in parallel with the judgment in the window-frame judgment unit; and
   a transfer controller programmed or configured to detect output of the judgment signal and completion of drawing in the section under drawing, to receive a transfer of the calculation data from the main deflector calculator, and to transfer the calculation data to the driving unit.

2. The lithography system according to claim 1, wherein the window-frame judgment unit and the main deflector calculator are configured to receive an input of the main deflector data concerning the section to be drawn next after the calculation data is transferred from the main deflector calculator to the transfer controller.

3. The lithography system according to claim 1, wherein the transfer controller obtains from the main deflector calculator the stage position information when the calculation data is calculated along with the calculation data.

4. The lithography system according to claim 1, further comprising a calculation data correction unit correcting the calculation data transferred from the main deflector calculator based on the difference between the stage position information when the calculation data is calculated, and present stage position information.

5. The lithography system according to claim 1, wherein the main deflector calculator calculates the calculation data in parallel with the judgment in the window-frame judgment unit.

6. The lithography system according to claim 1, further comprising a section drawing end judgment unit judging that drawing in the section under drawing has been completed.

7. The lithography system according to claim 1, further comprising a stage that holds the sample thereon, continuously moves in the first direction, and stepwise moves in the second direction perpendicular to the first direction,
   wherein the deflector comprises a main deflector that follows the motion of the stage in the first direction and positions the beam to one of the sections, and an auxiliary deflector that positions the beam in that section.

8. The lithography system according to claim 7, wherein the window-frame judgment unit and the main deflector calculator are configured to receive an input of the main deflector data concerning the section to be drawn next after the calculation data is transferred from the main deflector calculator to the transfer controller.

9. The lithography system according to claim 7, wherein the transfer controller obtains from the main deflector calculator the stage position information when the calculation data is calculated along with the calculation data.

10. The lithography system according to claim 7, further comprising a calculation data correction unit correcting the calculation data transferred from the main deflector calculator based on the difference between the stage position information when the calculation data is calculated, and present stage position information.

11. The lithography system according to claim 7, wherein the main deflector calculator calculates the calculation data in parallel with the judgment in the window-frame judgment unit.

12. The lithography system according to claim 7, further comprising a section drawing end judgment unit judging that drawing in the section under drawing has been completed.

13. A drawing method in a lithography system comprising a beam optical system that includes a deflector to deflect the beam, a driving unit that drives the deflector, and a stage enabled to mount the sample, comprising:
   generating main deflector data for deflecting the beam to one of a plurality of sections, the sections being made by dividing patterning data representing a pattern to be drawn;
   detecting a position of the stage to obtain stage position information;
   judging that the section to be drawn has entered a window-frame area where the beam may be scanned according to the main deflector data and the stage position information to output a judgment signal;
   calculating calculation data for driving the driving unit based on the main deflector data in parallel with the step of outputting the judgment signal; and
   detecting that the judgment signal has been output and drawing in the section under drawing has been completed to transfer the calculation data to the driving unit.

14. The drawing method according to claim 13, wherein the step of outputting the judgment signal and the step of calculating the calculation data are started after the transfer of the calculation data based on the main deflector data concerning the section to be drawn next, in parallel with the drawing by the calculation data.

15. The drawing method according to claim 13 further comprising correcting the calculation data transferred in the transferring step based on the difference between the stage position information when the calculation data is calculated, and present stage position information.

16. The drawing method according to claim 13, wherein the stage is configured to continuously move in the first direction and stepwise move in the second direction perpendicular to the first direction, and the deflector comprises a main deflector that follows the motion of the stage in the first direction and positions the beam to one of sections; and an auxiliary deflector that positions the beam in that section.

17. The drawing method according to claim 16, wherein the step of outputting the judgment signal and the step of calculating the calculation data are started after the transfer of the calculation data based on the main deflector data concerning the section to be drawn next, in parallel with the drawing by the calculation data.

18. The drawing method according to claim 16 further comprising correcting the calculation data transferred in the transferring step based on the difference between the stage position information when the calculation data is calculated, and present stage position information.

19. A lithography system that deflects a beam to draw a desired pattern on a sample, the system comprising:

- a beam optical system that includes a deflector to deflect the beam;
- a driving unit that drives the deflector;
- a data generation means for generating main deflector data for deflecting the beam to one of a plurality of sections, the sections being made by dividing patterning data representing a pattern to be drawn;
- a stage enabled to mount the sample;
- a position detector circuit detecting a position of the stage to obtain stage position information;
- a window-frame judgment means for judging that the section to be drawn has entered a window-frame area where the beam may be scanned according to the main deflector data and the stage position information to output a judgment signal;
- a main deflector calculator means for receiving the main deflector data as input in parallel with the window-frame judgment unit and for calculating calculation data for driving the driving unit based on the main deflector data in parallel with the judgment in the window-frame judgment means; and
- a transfer controller means for detecting output of the judgment signal and completion of drawing in the section under drawing to receive a transfer of the calculation data from the main deflector calculator and for transferring the calculation data to the driving unit.

* * * * *